United States Patent
Budd et al.

(10) Patent No.: US 9,314,864 B2
(45) Date of Patent: Apr. 19, 2016

(54) C4NP COMPLIANT SOLDER FILL HEAD SEALS

(75) Inventors: Russell A. Budd, North Salem, NY (US); John P. Karidis, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 937 days.

(21) Appl. No.: 11/774,713

(22) Filed: Jul. 9, 2007

(65) Prior Publication Data

US 2009/0014146 A1   Jan. 15, 2009

(51) Int. Cl.
*B23K 3/06* (2006.01)
*B23K 1/00* (2006.01)

(52) U.S. Cl.
CPC .......... *B23K 3/0638* (2013.01); *B23K 1/0016* (2013.01); *B23K 3/0607* (2013.01); *B23K 2201/40* (2013.01); *H05K 2203/0126* (2013.01)

(58) Field of Classification Search
CPC ............... B23K 3/0638; H05K 2203/0113; H05K 2203/0338; H05K 2203/0126
USPC ............ 228/33, 43; 277/641, 642, 644, 645, 277/647, 651
See application file for complete search history.

(56) References Cited

U.S. PATENT DOCUMENTS

| | | | |
|---|---|---|---|
| 2,462,596 A * | 2/1949 | Bent | 277/451 |
| 2,864,156 A | 12/1958 | Cardy | |
| 3,558,097 A * | 1/1971 | DeFrees | 251/88 |
| 3,814,445 A * | 6/1974 | Bitzan | 277/589 |
| 4,298,204 A * | 11/1981 | Jinkins | 277/641 |
| 4,344,632 A * | 8/1982 | Green et al. | 277/641 |
| 4,681,327 A * | 7/1987 | d'Agostino et al. | 277/587 |
| 5,244,143 A | 9/1993 | Ference et al. | |
| 5,254,362 A | 10/1993 | Shaffer et al. | |
| 5,478,700 A | 12/1995 | Gaynes et al. | |
| 5,545,465 A | 8/1996 | Gaynes et al. | |

(Continued)

FOREIGN PATENT DOCUMENTS

| | | |
|---|---|---|
| CN | 1396641 | 2/2003 |
| FR | 2858254 | 2/2005 |

(Continued)

OTHER PUBLICATIONS

Advanced Packaging Magazine, Nov. 2005.

(Continued)

*Primary Examiner* — Kevin E Yoon
*Assistant Examiner* — Jacky Yuen
(74) *Attorney, Agent, or Firm* — Fleit Gibbons Gutman Bongini & Bianco PL; Thomas Grzesik

(57) ABSTRACT

A seal, fill head, and system are provided. The seal is adapted to cooperate with a fill head that is configured to place conductive bonding material into cavities on a mold. The seal comprises a first outer wall that is configured to abut a first adjacent wall of a support groove in a fill head. A second outer wall is configured to abut a second adjacent wall of a support groove in a fill head. An outer horizontal wall is situated between the first outer wall and the second outer wall. The outer horizontal wall comprises at least a first portion that is configured to abut an upper portion of the support groove. A convex bottom portion extends from the first and second outer walls. The convex bottom portion is configured to cooperate with a top surface of a mold.

11 Claims, 7 Drawing Sheets

(56) References Cited

U.S. PATENT DOCUMENTS

| | | | |
|---|---|---|---|
| 5,593,080 A | 1/1997 | Teshima et al. | |
| 5,673,846 A | 10/1997 | Gruber | |
| 5,718,367 A | 2/1998 | Covell, II et al. | |
| 5,971,058 A * | 10/1999 | Bolde et al. | 164/130 |
| 6,056,191 A | 5/2000 | Brouillette et al. | |
| 6,105,852 A | 8/2000 | Cordes et al. | |
| 6,133,633 A | 10/2000 | Berger et al. | |
| 6,135,024 A | 10/2000 | Higashida et al. | |
| 6,153,505 A | 11/2000 | Bolde et al. | |
| 6,231,333 B1 | 5/2001 | Gruber et al. | |
| 6,332,569 B1 | 12/2001 | Cordes et al. | |
| 6,390,439 B1 | 5/2002 | Cordes et al. | |
| 6,394,334 B1 | 5/2002 | Brouillette et al. | |
| 6,454,154 B1 * | 9/2002 | Pedigo | 228/33 |
| 6,461,136 B1 | 10/2002 | Gruber et al. | |
| 6,523,833 B1 * | 2/2003 | Ishigaki et al. | 277/650 |
| 6,527,158 B1 | 3/2003 | Brouillette et al. | |
| 6,641,868 B2 | 11/2003 | Abe et al. | |
| 6,695,020 B2 * | 2/2004 | Sakaida et al. | 141/234 |
| 6,725,769 B1 | 4/2004 | Williams | |
| 6,832,747 B2 | 12/2004 | Cordes et al. | |
| 7,032,513 B2 | 4/2006 | Onishi et al. | |
| 7,090,459 B2 * | 8/2006 | Bhate et al. | 415/1 |
| 7,273,806 B2 | 9/2007 | Groves et al. | |
| 7,322,511 B2 | 1/2008 | Farrar et al. | |
| 7,410,090 B2 | 8/2008 | Cordes et al. | |
| 7,410,092 B2 | 8/2008 | Cordes et al. | |
| 7,416,104 B2 | 8/2008 | Cordes et al. | |
| 7,497,366 B2 | 3/2009 | Chey et al. | |
| 2001/0035450 A1 | 11/2001 | Mannhart et al. | |
| 2002/0109228 A1 | 8/2002 | Buchwalter et al. | |
| 2002/0125402 A1 | 9/2002 | Cordes et al. | |
| 2002/0175438 A1 | 11/2002 | Gruber et al. | |
| 2003/0170935 A1 | 9/2003 | Rutiser | |
| 2004/0108368 A1 | 6/2004 | Onishi et al. | |
| 2004/0188497 A1 | 9/2004 | Gruber et al. | |
| 2004/0238595 A1 | 12/2004 | Nogiwa et al. | |
| 2005/0051604 A1 | 3/2005 | Claver et al. | |
| 2005/0109823 A1 | 5/2005 | Gruber et al. | |
| 2005/0263571 A1 | 12/2005 | Belanger et al. | |
| 2006/0011712 A1 | 1/2006 | Oggioni | |
| 2006/0231591 A1 | 10/2006 | Gruber et al. | |
| 2007/0057027 A1 | 3/2007 | Bourrieres et al. | |
| 2007/0178625 A1 | 8/2007 | Danovitch et al. | |
| 2007/0246511 A1 | 10/2007 | Cordes et al. | |
| 2007/0246516 A1 | 10/2007 | Cordes et al. | |
| 2007/0272389 A1 | 11/2007 | Gruber et al. | |
| 2008/0272177 A1 | 11/2008 | Cordes et al. | |
| 2008/0285136 A1 | 11/2008 | Jacobowitz et al. | |

FOREIGN PATENT DOCUMENTS

| | | |
|---|---|---|
| JP | 08011287 | 1/1996 |
| WO | 0149422 | 7/2001 |
| WO | 0219782 | 3/2002 |
| WO | 2005011877 | 2/2005 |

OTHER PUBLICATIONS

Gruber, et al., "Low-cost wafer bumping," IBM J. Research and Development, vol. 49, No. 4.5, Jul./Sep. 2005, pp. 621-639.

Technology Roadshow 2005 for Advanced Packaging, MEMS and Nanotechnologies.

* cited by examiner

# C4NP COMPLIANT SOLDER FILL HEAD SEALS

CROSS REFERENCE TO RELATED APPLICATION

The present patent application is also related to co-pending and commonly owned U.S. patent application Ser. No. 11/409,232, entitled "Rotational Fill Techniques For Injection Molding Of Solder"; U.S. patent application Ser. No. 11/409,233, entitled "FILL HEAD FOR INJECTION MOLDING OF SOLDER"; U.S. patent application Ser. No. 11/409,242, entitled "UNIVERSAL MOLD FOR INJECTION MOLDING OF SOLDER"; and U.S. patent application Ser. No. 11/409,244, entitled "CONDUCTIVE BONDING MATERIAL FILL TECHNIQUES", all filed on Apr. 21, 2006, the entire collective teachings of which being hereby incorporated by reference.

FIELD OF THE INVENTION

The present invention generally relates to the field of placement of conductive bonding material such as solder on electronic pads, and more particularly relates to fill heads and their seals for depositing conductive bonding material on electronic pads or to fill mold plates for transfer to electronic pads.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die.

Injection molded solder ("IMS") is a technique that dispenses molten solder instead of solder paste. U.S. Pat. No. 5,244,143, which is commonly owned by International Business Machines Corporation, discloses the injection molded solder technique and is hereby incorporated by reference in its entirety. One of the advantages of the IMS technique is that there is very little volume change between the molten solder and the resulting solder bump. The IMS technique utilizes a solder head that fills molds of various materials such as borosilicate glass, silicon, polymers, metals, and the like that are wide enough to cover most single chip modules. Solder is dispensed into mold cavities as the solder head moves across the mold.

The IMS method for solder bonding is then carried out by applying a molten solder to a substrate in a transfer process. When smaller substrates, i.e., chip scale or single chip modules are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped.

A subset technology of IMS is Controlled Collapse Chip Connection New Process ("C4NP. The solder bumps can be inspected in advance and deposited onto the mold in one simple step using this technology. In this technology, a solder head with an injection aperture comprising molten solder scans over the surface of the mold. In order to fill the cavities on the mold, pressure is applied onto the reservoir of the C4NP head which comprises the molten solder as it is scanned over the cavities.

One problem with the current C4NP process is with respect to the fill heads used during the process to place the solder bumps onto molds. Current fill heads comprise a somewhat rigid seal that retains molten solder within the fill head and contacts the mold as the fill head dispenses the solder. However, as the fill head moves across the mold plate the distance between the fill head and the mold plate varies due to the mechanical tolerances of the system. With a somewhat rigid seal this height variation leads to a seal contact force and contact width variation. These variations in seal contact force and width leads to excessive seal wear, poor cavity fill, and can lead to solder leaks in regions of low seal force. Another problem with current C4NP processes is that "round" O-ring seals are utilized within the fill heads. These O-ring seals are prone to rolling in their support groove, which leads to premature seal failure.

Therefore a need exists to overcome the problems with the prior art as discussed above.

SUMMARY OF THE INVENTION

Briefly, in accordance with the present invention, disclosed are a seal, fill head, and system. The seal is adapted to cooperate with a fill head configured to place conductive bonding material into cavities on a mold. The seal includes a first outer wall that is configured to abut a first adjacent wall of a support groove in a fill head. A second outer wall is configured to abut a second adjacent wall of a support groove in a fill head. A contact surface extends downward from the first outer wall and the second outer wall. The contact surface portion is configured to cooperate with a top surface of a mold.

In another embodiment a fill head for placing conductive bonding material into a plurality of cavities in a mold is disclosed. The fill head comprises a seal support groove situated on a bottom surface. The seal support groove includes a first side wall and a second side wall. At least one horizontal upper wall is situated above at least one of the first side wall and the second side wall. A seal is situated within the seal support groove. The seal includes a first outer wall that is configured to abut the first side wall of the seal support groove. A second outer wall is configured to abut the second side wall of the seal support groove. A contact surface extends downward from the first outer wall and the second outer wall. The contact surface portion is configured to cooperate with a top surface of a mold.

A system of placing conductive bonding material into a plurality of cavities in a mold is disclosed. The system comprises a controller, a mold comprising a plurality of cavities, and a fill head for depositing conductive bonding material on the mold. The fill head comprises a seal support groove situated on a bottom surface. The seal support groove includes a first side wall and a second side wall. The seal support groove also includes at least one horizontal upper wall situated above at least one of the first side wall and the second side wall. A seal is situated within the seal support groove. The seal includes a first outer wall that is configured to abut the first wall of the seal support groove. A second outer wall is configured to abut the second side wall of the seal support groove. A contact surface extends downward from the first outer wall and the second outer wall. The contact surface portion is configured to cooperate with a top surface of a mold.

An advantage of the foregoing embodiments of the present invention is that a fill head seal is provided that is configured to be securely held in the fill head thereby avoiding rotational or rolling movement. The present invention improves the reliability of the conductive bonding material fill process and provides improved compliance compared with conventional seals. Another advantage of the present invention is that it ensures proper seal contact force and width across the entire fill head surface ensuring consistent mold plate cavity fill with minimal seal wear

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically.

Current C4NP Fill Head and Mold Fill Process

Figure 1:
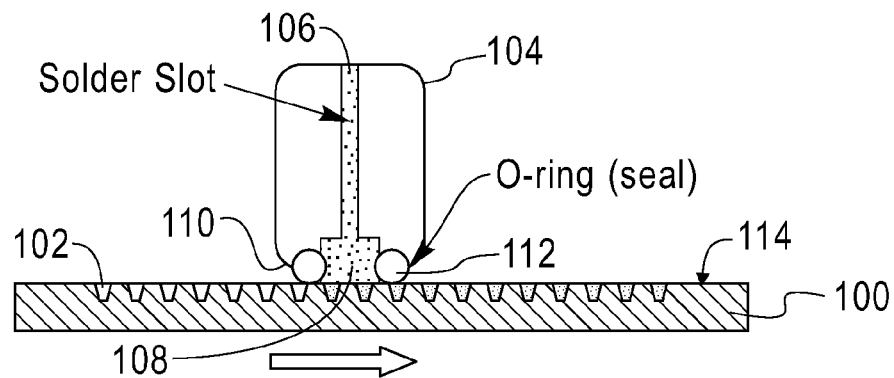
FIG. 1 is a block diagram showing a side perspective view of a current C4NP fill head used for placing solder on a mold plate.
Figure 2:
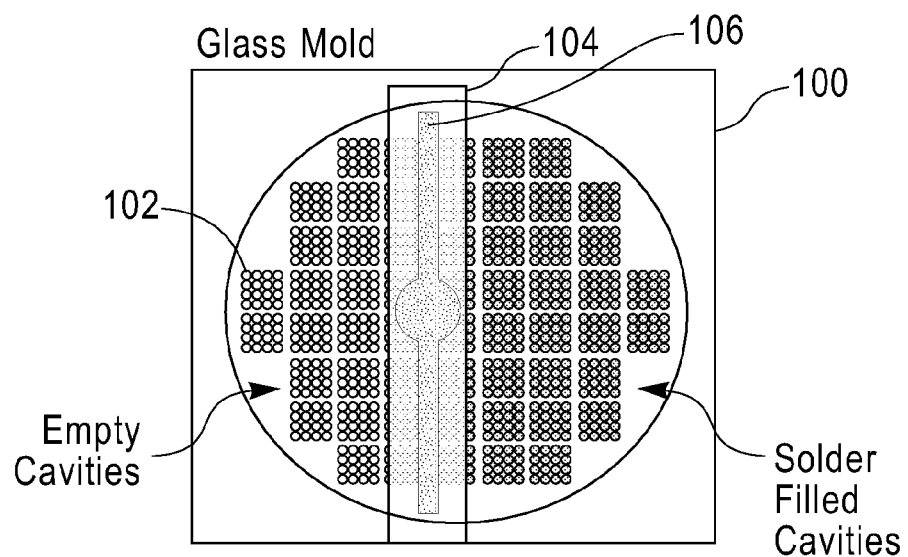
FIG. 2 is a block diagram showing a top perspective view of the fill head and mold plate of FIG. 1.

FIG. 1 illustrates a side perspective view of a current C4NP fill head used for placing solder on a mold plate. FIG. 2 illustrates a top perspective view of the fill head and mold plate of FIG. 1. FIG. 1 shows a rectangular mold 100 comprising a plurality of cavities 102. FIG. 1 also shows a fill head 104 for placing conductive bonding material such as solder into the plurality of cavities 102. The fill head 104 comprises a slot 106 for allowing solder to travel from a reservoir (not shown) to an opening 108 situated on a bottom portion 110 of the fill head 104. The fill head 104 also comprises a seal 112 such as an O-ring that traverses a perimeter of the bottom portion 110 of the fill head 104. It should be noted that the seal 112 in FIG. 1 is only shown as being non-continuous to illustrate the opening 108.

The seal 112 substantially contacts an upper surface 114 of the rectangular mold 100. The fill head 104 is heated above the melting point of the solder, for the case of Tin/Copper solder above 230 C. The liquid solder is held in the reservoir (not shown) residing within the fill head 104. As the fill head 104 rests on the rectangular mold plate 104, the O-ring seal 112 prevents the solder from leaking out the opening 108 of the fill head 104. The fill process begins by first applying a nominal load or down force on the O-ring seal 112, which in one non-limiting example is typically on the order of 2.5 lbs/linear inch.

It should be noted that the actual pressure (lbs/in$^2$) under the seal 112 depends on how the seal 112 flattens out when pressed against the mold 100, and varies depending, among other things, upon the seal geometry and its material properties. Additionally, the pressure within the seal 112 to mold contact zone is not uniform due to the curved shape of the seal 112. The load force applied on the seal 112, on the other hand, can be specified more simply and consistently, for example specified as "load per unit length" where the length is taken as the longest dimension of the plane of the load force applied on the seal 112, and with the understanding that the corresponding pressure under the seal 112 when applying the load force on the seal 112 varies due to many factors. Therefore, it is convenient for the present discussion to quantify the seal load in terms of "load per unit length".

The fill head reservoir (not shown) is then pressurized, usually to 20 psi, to ensure the solder enters the mold plate cavities 102 during the fill process. Next, the fill head is moved across the upper surface 114 of the mold 100, typically at a speed of between 0.1 to 10 mm/sec. As the fill head 104 moves over the mold plate the air in the cavities is expelled and replaced by liquid solder from the fill head. The mold plate with the solder fill cavities is then removed and passed to the next tool for transfer of the solder to a silicon wafer.

Figure 3:
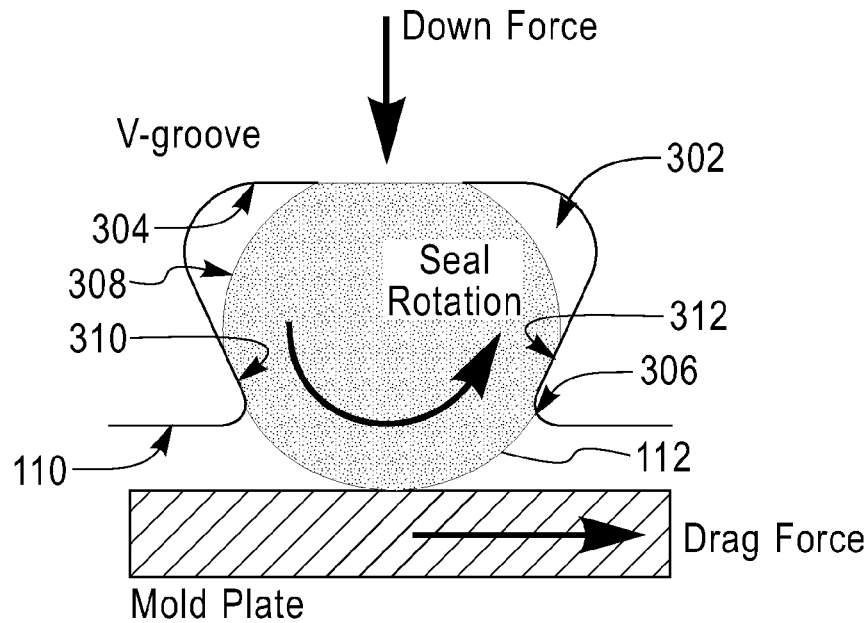
FIG. 3 is a diagram showing a cross-sectional view of a seal and related areas of the fill head of FIG. 1.

However, the seal 112 of the fill head 104 is not configured to resist rotation. For example, FIG. 3 illustrates a cross-sectional view of the seal 112 and related areas of the fill head 104. FIG. 3 shows the seal 112 residing within a groove 302 that traverses the perimeter of bottom portion 110 of the fill head 104. The groove 302 is configured in an inverted V-shape configuration where a top portion 304 of the groove 302 is wider than a bottom portion 306 of the groove 302. The seal 112 has a substantially circular contour wherein an outer surface 308 of the seal abuts a first inwardly extending edge 310 and a second inwardly extending edge 312 of the groove 302.

As the fill head 104 is moved in a linear direction across the mold plate 100, the seal 112 experiences frictional drag forces. These drag forces cause the seal 112 to experience a fairly substantial rotational moment. This is due to the fact that the seal is substantially circular contoured and is not configured to prevent rotational movement. Seal rotation leads to variations in the seal wear pattern, which eventually cause the seal to leak solder and fail. Another deficiency of this design is the limited seal compliance. For a typical ⅛ inch diameter round seal and a nominal seal load of 2 lbs/in a height variation of 0.002 inch leads to a seal force variation of nearly 50%. Well controlled gaps are difficult to control over the length of the fill head (>300 mm) and during the mold plate fill. A 50% variation in seal load may lead to uneven mold plate cavity fills, and excessive seal loads.

Therefore, the present invention provides a seal that is configured to be securely held in the fill head thereby avoiding rotational or rolling movement. The present invention improves the reliability of the conductive bonding material fill process and provides improved compliance compared with conventional seals. Another advantage of the present invention is that it ensures proper seal contact force and width across the entire fill head surface ensuring consistent mold plate cavity fill with minimal seal wear.

Exemplary Fill Head Seal and Fill Head Configuration

Figure 4:
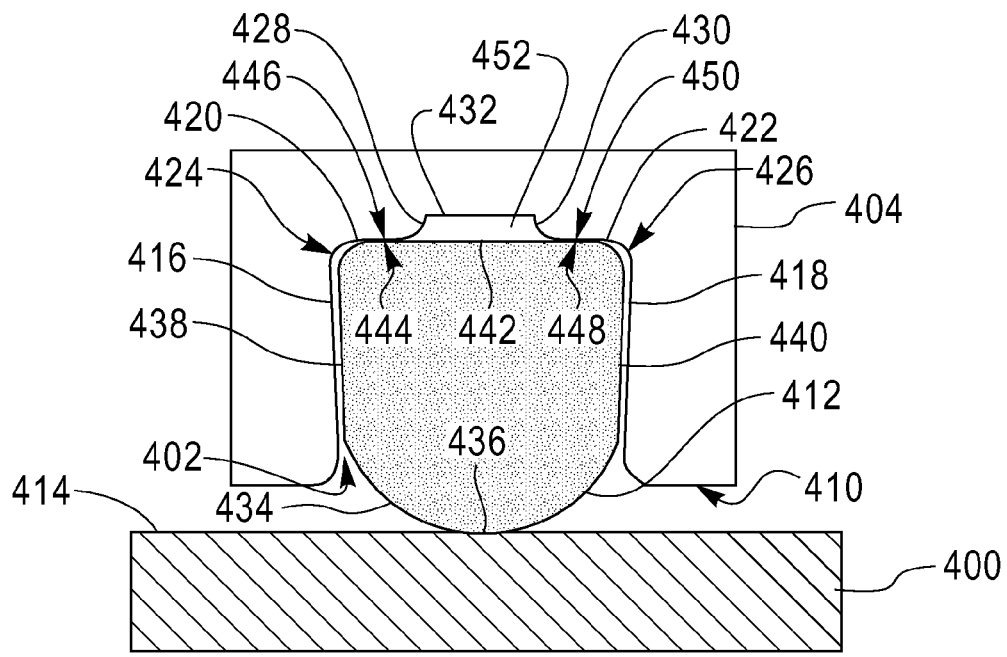
FIG. 4 is a diagram showing a cross-sectional view of an exemplary fill head seal and related areas of the fill head according to an embodiment of the present invention.

FIG. 4 illustrates a cross-sectional view of an exemplary fill head seal and related areas of a fill head. FIG. 4 shows a partial view of an exemplary fill head 404, fill head seal 412, and mold 400. In one embodiment, the fill head 404 is configured to deposit conductive bonding material on a mold 400. In one embodiment, the fill head 404 is for depositing conductive bonding material on a substrate that is situated on the rectangular mold 400 using linear fill techniques. Linear fill techniques and other conducting bonding material fill techniques applicable to the present invention are discussed in the co-pending and commonly owned U.S. patent application Ser. No. 11/409,244, entitled "Conductive Bonding Material Fill Techniques", which has been incorporated by reference in its entirety. Rectangular molds and universal molds such as those discussed in the co-pending and commonly owned U.S. patent application Ser. No. 11/409,242, entitled "Universal Mold For Injection Molding Of Solder, which has been incorporated by reference in its entirety, are also applicable to the present invention.

It should be noted that linear fill techniques are used only as one non-limiting example applicable to the present invention. For example, the present invention is also applicable to rotational fill techniques discussed in the co-pending and commonly owned U.S. patent application Ser. No. 11/409,232, entitled "Rotational Fill Techniques For Injection Molding Of Solder", which has been incorporated by reference in its entirety. It should also be noted that rectangular molds are used only as one non-limiting example applicable to the present invention. The present invention is also applicable to non-rectangular molds.

The present invention, according to one embodiment, is also applicable to fill heads and seals used to deposit conductive bonding material on non-rectangular molds such as those discussed in the co-pending and commonly owned U.S. patent application Ser. No. 11/409,232, entitled "Rotational Fill Techniques For Injection Molding Of Solder", which has been incorporated by reference in its entirety.

FIG. 4 shows the fill head 404 comprising a seal support groove 402. The seal support groove 402 comprises a first vertical wall 416 and a second vertical wall 418. The first and second vertical walls 416, 418, in one embodiment, are parallel to each other. It should be noted that the present invention is not limited to having the first and second vertical walls of a seal support groove being substantially vertical, as shown in FIG. 1. For example, the vertical walls of a seal and seal support groove can also be angled. The angle can be such that installation of a seal is made easier; for preventing rotation of the seal; or to ensure retention of the seal in the groove. Examples of these embodiments are discussed in greater detail below.

The seal support groove 402 also comprises a first inwardly extending wall 420 and a second inwardly extending wall 422. The first inwardly extending wall 420 adjoins with an upper portion 424 of the first vertical wall 416. The second inwardly extending wall 422 adjoins with an upper portion 426 of the second vertical wall 418. An exposed vertical edge 428 of the first inwardly extending wall 420 and an exposed vertical edge 430 of the second inwardly extending wall 422 adjoin with a horizontal wall 432.

The seal 412, in one embodiment, comprises a contact surface 434, wherein at least a portion 436 of the contact surface 434 contacts a top surface 414 of the mold 400. Also, at least part of the contact surface 434 extends below a bottom surface 410 of the fill head 404. It should be noted that the contact surface 434 can be curved, straight, or the like. The seal 412 also comprises a first vertical wall 438 and a second vertical wall 440. In one embodiment, the first and second vertical walls 438, 440 can be angled or parallel to each other and reside on opposite sides of the seal 412. It should be noted that the vertical walls 438, 440 of the seal 412 can also be angled.

The seal 412 also includes an upper horizontal wall 442 that is adjoined with the first vertical wall 438 and the second vertical wall 440. A first portion 444 of the upper horizontal wall 442 contacts a bottom surface 446 of the first inwardly extending wall 420 of the support groove 402. A second portion 448 of the upper horizontal wall 442 contacts a bottom surface 450 of the second inwardly extending wall 422 of the support groove 402. Although shown as slightly separated in FIG. 4, the first and second vertical walls 416, 418 of the support groove 402 may abut the first and second vertical walls 438, 440 of the seal 412, respectively. They have been shown as separated in FIG. 4 for illustration purposes.

The contact between the first and second inwardly extending walls 420, 422 of the support groove 402 and the upper horizontal wall 442 of the seal 412 prevents the seal 412 from rotating within the support groove 402. The contact between the first and second vertical walls 416, 418 of the support groove 402 and the first and second vertical walls 438, 440 of the seal 412 also prevents the seal 412 from rotating within the support groove 402. Also, even if the first and second vertical walls 416, 418 of the support groove 402 and the first and second vertical walls 438, 440 of the seal 412 were separated, these elements abut each other as soon as the seal 412 begins to rotate. It should be noted that the length and angle of the seal side walls and the support groove walls can be adjusted as deemed necessary. Also, a relief area 452 resides within the support groove 402, thereby improving the overall compliance of the seal 412. For example, when a load is applied the seal 412 is allowed to flex and move into the relief area 452 of the support groove 402. The relief area 452 provides room for seal motion, thereby softening and improving the overall seal compliance.

Figure 5:
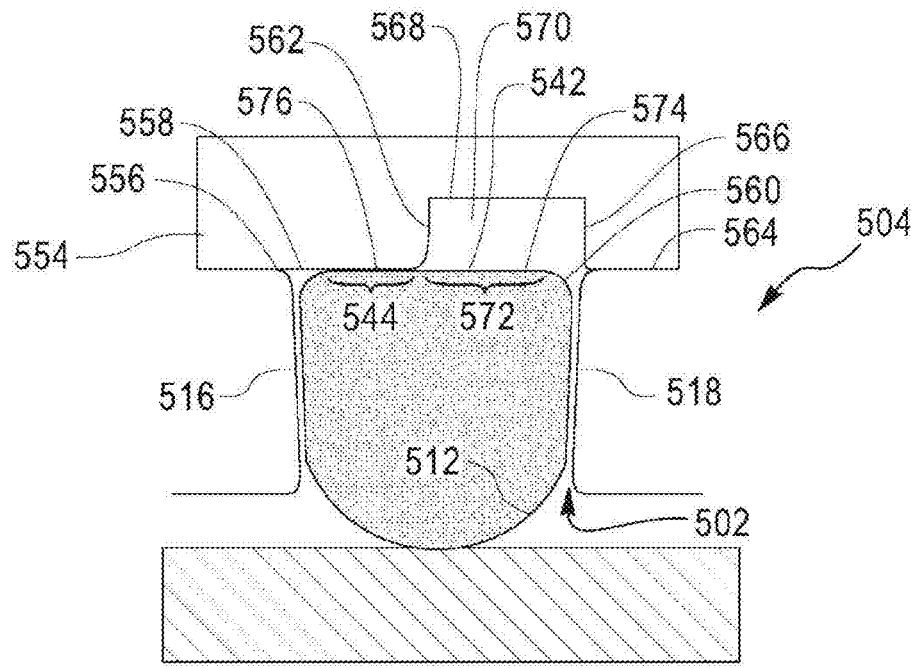
FIG. 5 is a diagram showing a cross-sectional view of another exemplary fill head and seal according to an embodiment of the present invention.

FIG. 5 illustrates a cross-sectional view of another exemplary fill head 504 and seal 512. FIG. 5 shows a seal support groove 502 comprising a first vertical wall 516 and a second vertical wall 518. The first and second vertical walls 516, 518, in one embodiment, can be angled or parallel to each. The fill head 504 also comprises an offset back support 554 for supporting the seal 512. The offset back support 554 comprises a first bottom portion 556 residing on top of the first vertical wall 516 of the support grove 502. The first bottom portion 556 includes a horizontal wall 558 that extends inwardly over a top portion 560 of the support grove 502. The horizontal wall 558 adjoins with a first upwardly extending vertical wall 562. The offset back support 554 also comprises a second bottom portion 564 residing on top of the second vertical wall 518 of the support groove 502.

The second bottom portion 564 comprises a second upwardly extending vertical wall 566 that is in substantial alignment with the second vertical wall 518 of the support grove 502. A horizontal wall 568 is situated between and adjoined with the first upwardly extending vertical wall 562 and a second upwardly extending vertical wall 566 thereby creating a relief area 570 above a portion 572 of a top surface 574 of the seal 512. In one embodiment the relief area is off-centered with respect to the seal 512. The offset back support 554 and relief area 570 provide room for seal motion, thereby softening and improving the overall seal compliance. It should be noted that the arrangement of the offset back support 554 can be flipped so that the horizontal wall 558 that extends inwardly over the top portion 560 of the support grove 502 extends inwardly from the second vertical wall 518 of the support grove 502.

The seal 512 comprises substantially the same configuration of the seal 412 discussed above with respect to FIG. 4. However, only a first portion 544 of the upper horizontal wall 542 abuts another surface, which is a bottom surface 576 of the horizontal wall 558 that extends inwardly over the top portion 560 of the support grove 502.

Figure 6:
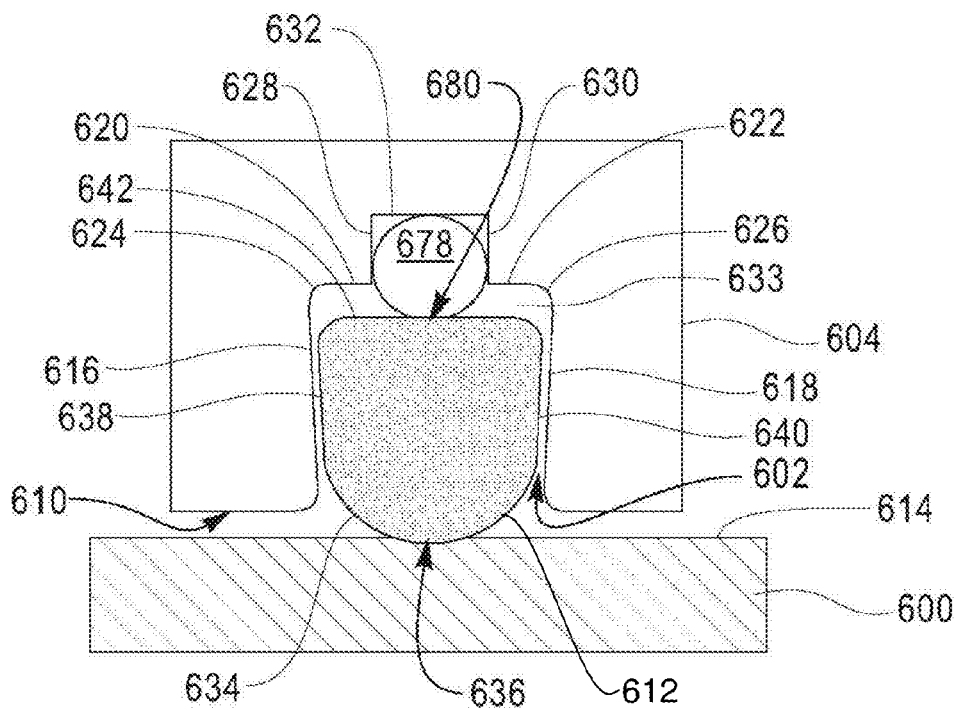
FIG. 6 to FIG. 8 are diagrams showing cross-sectional views of an exemplary fill head and seal, wherein a support groove within the fill head comprises a compliant support member according to one embodiment of the present invention.
Figure 7:
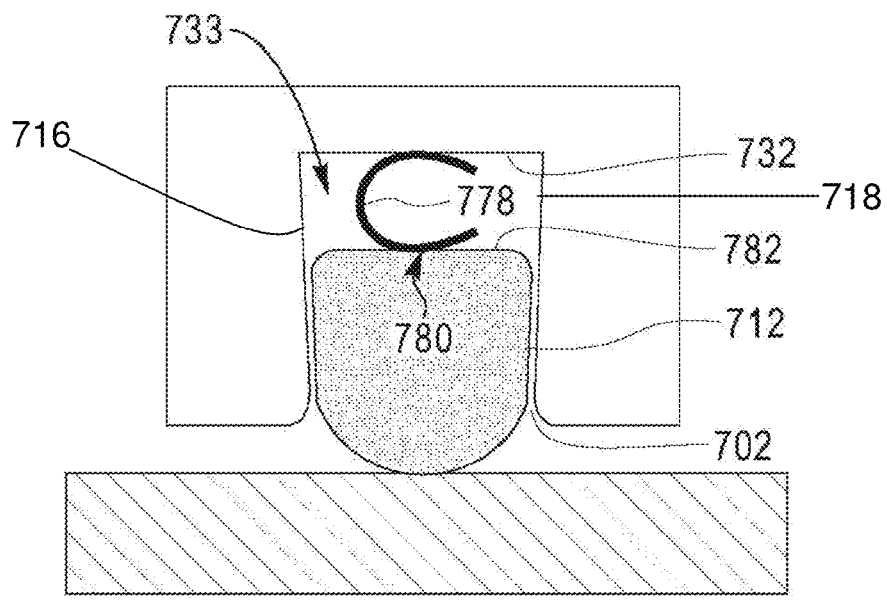
Figure 8:
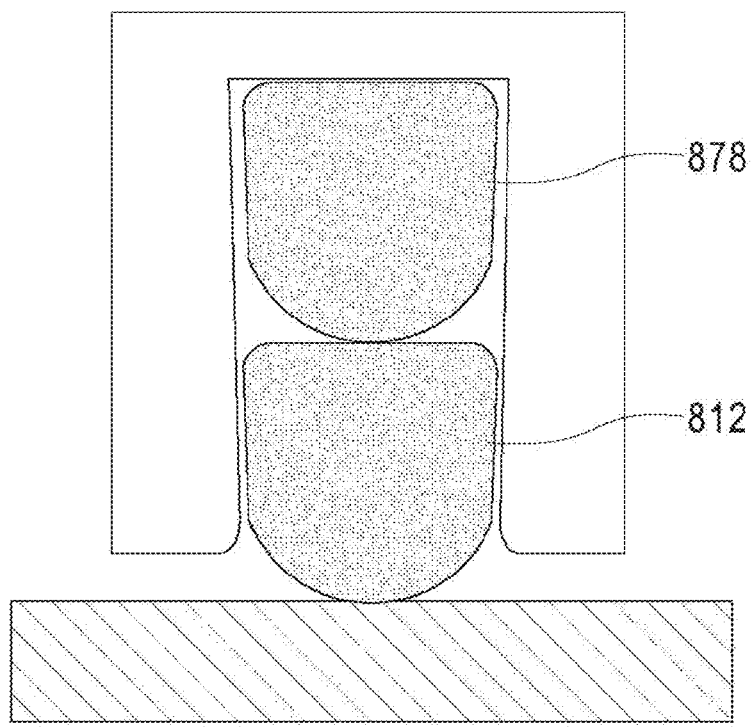

FIG. 6 to FIG. 8 illustrates cross-sectional views of an exemplary fill head and seal, wherein a support groove within the fill head comprises a compliant support member. The fill head 604 comprises a seal support grove 602. The seal support groove 602 comprises a first vertical wall 618 and a second vertical wall 618. The first second vertical walls 616, 618, in one embodiment, can be angled or parallel to each other. The seal support groove 602 also comprises a first inwardly extending wall 620 and a second inwardly extending wall 622. The first inwardly extending wall 620 adjoins with an upper portion 624 of the first vertical wall 616. The second inwardly extending wall 622 adjoins with an upper portion 626 of the second vertical wall 618. An exposed vertical edge 628 of the first inwardly extending wall 620 and an exposed vertical edge 630 of the second inwardly extending wall 622 adjoin with a horizontal wall 632.

The seal 612, in one embodiment, comprises a contact surface 634, wherein at least a portion 636 of the contact surface 634 contacts a top surface 614 of the mold 600. Also, at least part of the contact surface 634 extends below a bottom surface 610 of the fill head 604. It should be noted that the contact surface 634 can be curved, straight, or the like. The seal 612 also comprises a first vertical wall 638 and a second vertical wall 640. In one embodiment, the first and second vertical walls 638, 640 can be angled or parallel to each other and reside on opposite sides of the seal 612. The seal 612 also includes an upper horizontal wall 642 that is adjoined with the first vertical wall 638 and the second vertical wall 640. A relief area 633 exists above the seal 612.

FIG. 6 also shows a resilient support member 678, wherein at least a portion of the resilient member 678 is situated within the relief area 633. The resilient support member 678 can be comprised of a soft polymer or any other resilient material. In the example of FIG. 6, the resilient support member 678 is circular such as an O-ring. A bottom portion 680 of the resilient member 678 contacts the upper horizontal wall 642 (upper surface) of the seal 612. The resilient support member 678 enables the seal 612 to move up and down within the support groove 602 in order to follow the mold surface. This movement allows for variations in fill head to mold plate height to be normalized. In other words, the resilient support member 678 allows for consistent deposition of conductive bonding material even though variations in fill head to mold plate height are encounter by the fill head 604.

FIG. 7 illustrates another example of a support grove 702 comprising a resilient support member 778. The seal support groove 702 comprises a first vertical wall 716 and a second vertical wall 718. The first and second vertical walls 716, 718, in one embodiment, can be angled or parallel to each other. The seal support groove 702 also comprises an upper horizontal wall 732 that adjoins the first vertical wall 716 and the second vertical wall. This creates a relief area 733 above the seal 702.

FIG. 7 also shows a resilient support member 778 situated within the relief area 733. The resilient support member 778 in the example of FIG. 7 is a spring. A bottom portion 780 of the resilient member 778 contacts a top surface 782 of the seal 712. As discussed above, the resilient support member 778 enables the seal 712 to move up and down within the support groove 702 in order to follow the mold plate surface. This movement allows for variations in fill head to mold plate height to be normalized. In another embodiment, the resilient member 778 can be another seal 878 residing on top of the seal 812, as shown in FIG. 8. It should be noted that the resilient members discussed above with respect to FIGS. 6-8 are only examples and do not limit the present invention in any way. The present invention is applicable to any support groove and resilient support member configuration that allows the seal to move up and down within the support groove in order to follow the mold plate surface.

Figure 9:
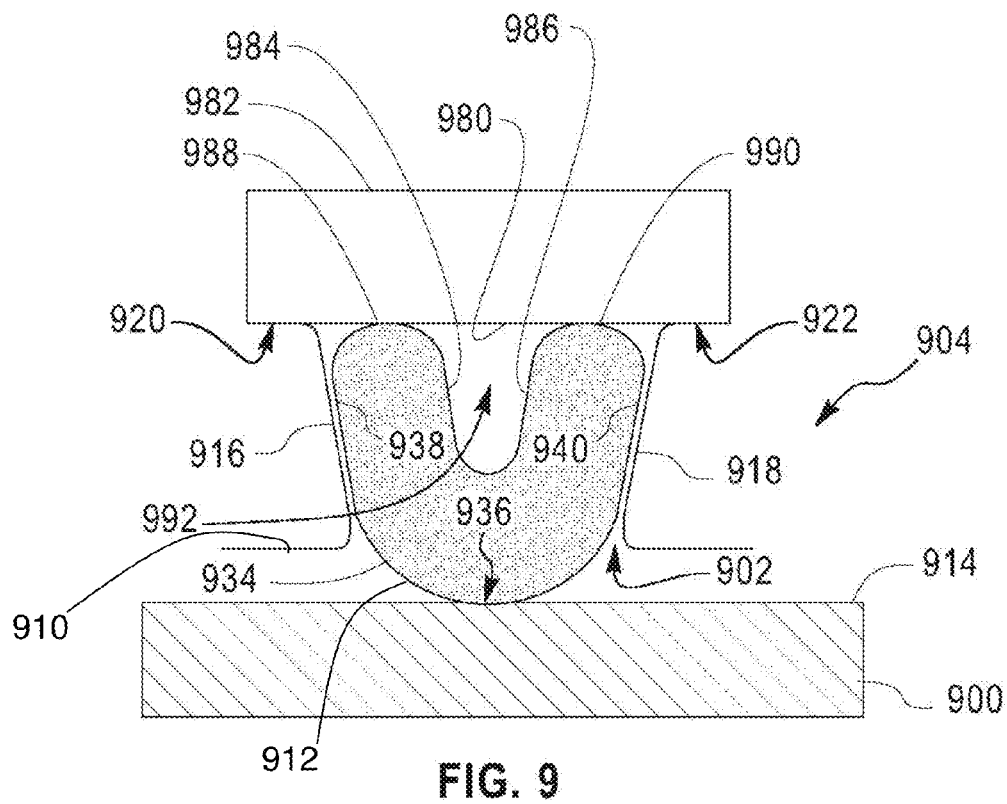
FIG. 9 is a diagram showing a cross-sectional view of another exemplary seal comprising a seal support grove according to one embodiment of the present invention.

FIG. 9 is a cross-sectional view illustrating another exemplary seal. FIG. 9 shows a fill head 904 comprising a seal support grove 902. The seal support grove 902 comprises a first diagonally vertical wall 916 and a second diagonally vertical wall 918. The term diagonally vertical is used to describe a nearly vertical wall structure. Each of the diagonally vertical walls 916, 918 extend in an inward fashion from top to bottom. A top portion 920, 922 of each of the diagonally vertical walls 916, 918 abut a bottom surface 980 of a horizontal wall 982. The seal 912, in one embodiment, comprises a contact surface 934, wherein at least a portion 936 of the contact surface 934 contacts a top surface 914 of the mold 900. Also, at least part of the contact surface 934 extends below a bottom surface 910 of the fill head 904. The seal 912 comprises a first outer diagonally vertical wall 938 and a second diagonally vertical wall 940 each following the same angle of the diagonally vertical walls 916, 918 of the support grove 902. As discussed above with respect to FIG. 1, the side walls 916, 918 of a seal support groove 902 can either be angled, as shown in FIG. 9 or substantially vertical, as shown in FIG. 4. The same is applicable to the side walls 938, 940 of a seal 912.

The seal 912, at least when situated inside the seal support groove 902, also comprises a first inner diagonally vertical wall 984 and a second inner diagonally vertical wall 986. The first outer diagonally vertical wall 938 and the first inner diagonally vertical wall 984 each communicate with a first upper portion 988 of the seal 912. The second outer diagonally vertical wall 940 and the second inner diagonally vertical wall 986 each communicate with a second upper portion 990 of the seal 912. At least part of the first upper portion 988 and at least part of the second upper portion 990 contacts the bottom surface 980 of the horizontal wall thereby preventing seal rotation.

Figure 10:
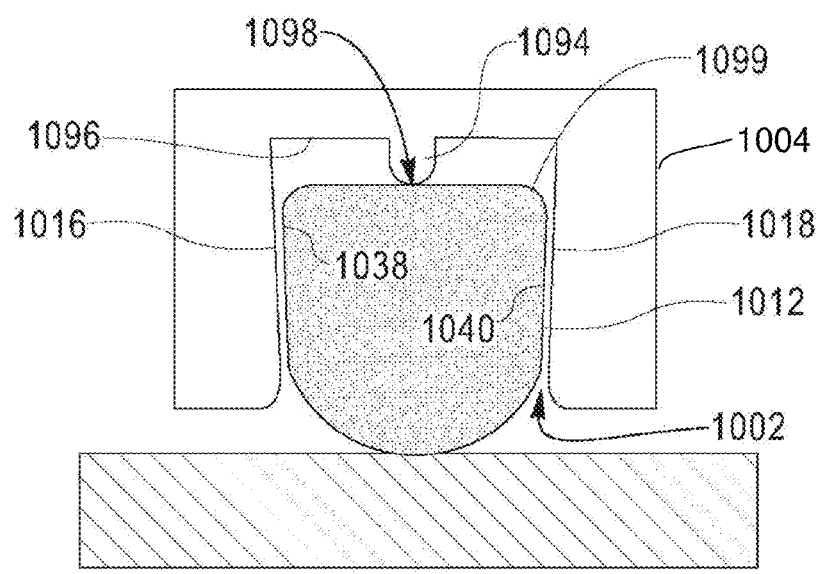
FIG. 10 is a diagram showing a cross-sectional view of a fill head comprising a seal support groove with a center backstop according to one embodiment of the present invention.
Figure 11:
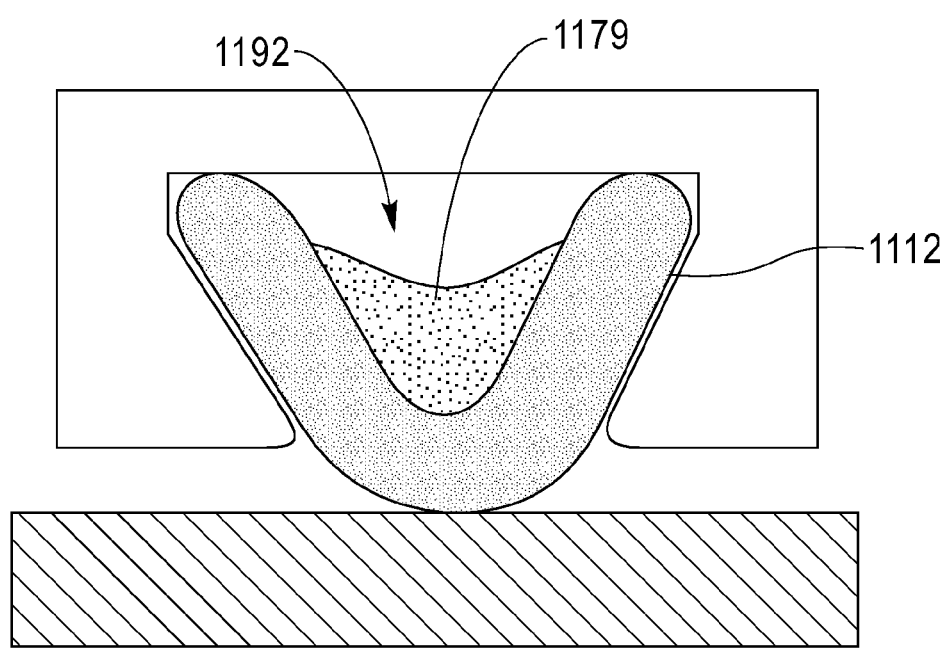
FIG. 11 is a diagram showing a cross-sectional view of a fill head comprising a seal support groove with resilient material being molded to the seal within a relief area according to one embodiment of the present invention.

A relief area 992 is created between the first and second inner diagonally vertical walls 984, 986. The relief area 992, which can be varied, allows for the overall compliance of the seal 912 to be controlled. It should be noted that FIG. 9 illustrates only one configuration and that wall angles and heights of both the support groove and seal can be varied. For example, the relief area 992 can comprise a resilient member 678, 778 such as an O-ring as discussed above with respect to FIG. 6 and FIG. 7. Also, resilient material 1179 can be molded to the seal 1112 within the relief area 1192 as shown in FIG. 11. The resilient material 1179 can be a stronger material than the seal 1112, thereby providing strength and rigidity to the seal 1112. Alternatively, the resilient material 1179 can be a weaker material than the seal 1112, thereby providing less support to the seal FIG. 10 illustrates a cross-sectional view of a fill head 1004 comprising a seal support groove 1002 with a center backstop 1094. The seal 1012 and the seal support groove 1002 are configured similar to the seals and support grooves discussed above. However, a center backstop 1094 extends in a downward fashion from a top surface 1096 of the support groove 1002. A bottom surface 1098 of the center backstop 1094 abuts a top surface 1099 of the seal 1012. The center backstop 1094 provides support for the seal 1012 within the support groove 1002. Seal rotation is prevented by the side walls of the seal groove 1016, 1018 abutting the side walls 1038, 1040 of the seal 1012. The center backstop 1094 allows for resilient vertical movement of the seal 1012 within the support groove 1002. This allows the seal 1012 to follow varying mold surface heights.

Figure 12:
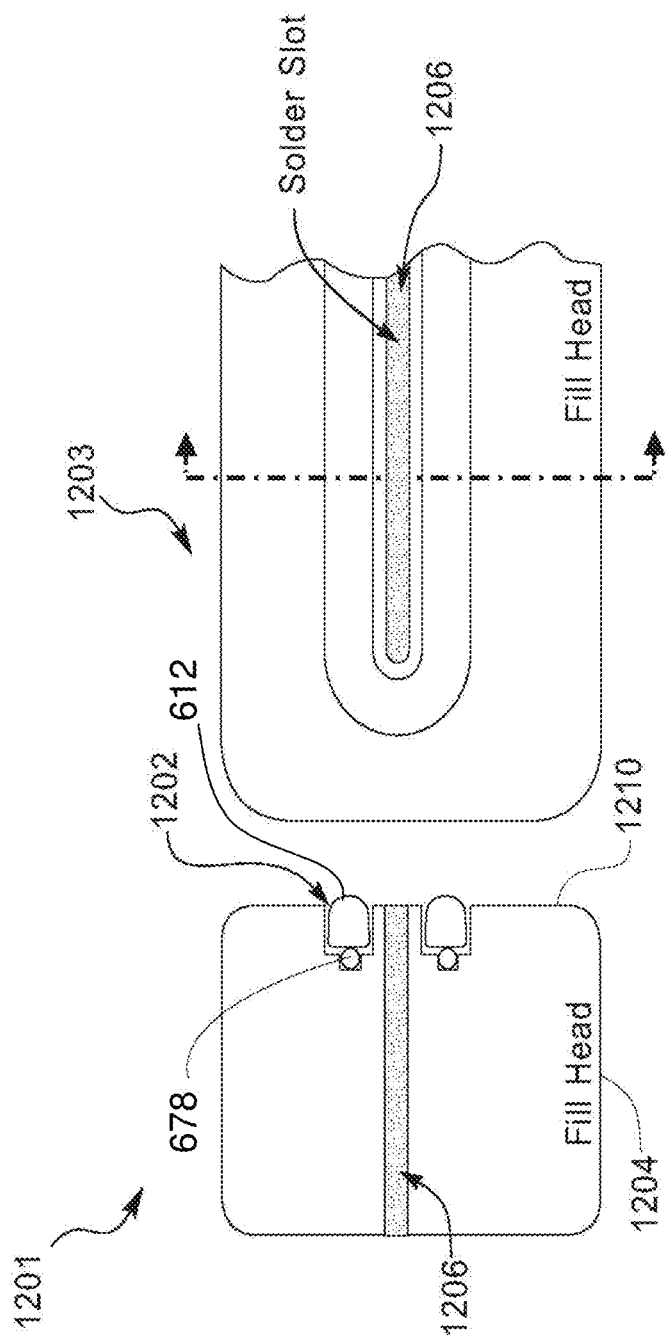
FIG. 12 is a diagram showing two views, a side view and a bottom view, of an exemplary fill head according to one embodiment of the present invention.

FIG. 12 illustrates a side view 1201 and bottom view 1203 of an exemplary fill head. FIG. 12 shows a first support groove 1202 that traverses a contoured perimeter of a bottom surface 1210 of the fill head 1204 and surrounds a solder slot 1206. A seal 612 and a resilient member 678 resides within the support groove 1202 and traverse the entire groove 1202.

Non-Limiting Examples

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A sealing system configured to cooperate with a conductive bonding material fill system, the sealing system comprising:
   a support groove disposed within a fill head, the support groove comprising:
   a first side wall;
   a second side wall situated opposite from the first side wall;
   a horizontal upper wall situated above and perpendicular to at least one of the first side wall and the second side wall, the horizontal upper wall extending from the first side wall and the second side wall;
   a support member extending from the horizontal upper wall;
   a first relief area disposed between an upper portion of the first side wall and the support member; and
   a second relief area disposed between an upper portion of the second side wall and the support member; and
   a seal situated within the support groove, the seal comprising:
   a first outer wall;
   a second outer wall;
   an upper horizontal wall situated between and substantially perpendicular to the first outer wall and the second outer wall, wherein the upper horizontal wall is substantially parallel to the horizontal upper wall of the support groove, wherein a bottom surface of the support member abuts a top surface of the upper horizontal wall, and wherein the seal is free from contact with the first and second side walls of the support groove until a force is applied to the seal; and
   a contact surface adjoining and extending downward from the first outer wall and the second outer wall.

2. The sealing system of claim 1, wherein the first outer wall is one of substantially vertical and angled, and wherein the second outer wall is one of substantially vertical and angled.

3. The sealing system of claim 1, wherein the first side wall of the support groove is one of substantially vertical and angled, and wherein the second side wall of the support groove is one of substantially vertical and angled.

4. The sealing system of claim 1, wherein at least a portion of the upper horizontal wall is configured to deform into at least one of the first and second relief areas of the support groove when an upward vertical force is applied to the contact surface.

5. The sealing system of claim 1, wherein the first outer wall is configured to abut the first side wall of the support groove in the fill head when a rotational force is experienced thereby preventing rotation within the support groove.

6. The sealing system of claim 1, wherein the second outer wall is configured to abut the second side wall of the support groove in the fill head when a rotational force is experienced thereby preventing rotation within the support groove.

7. The sealing system of claim 1, where in the first outer wall and the second outer wall are situated substantially parallel to each other.

8. A fill head for placing conductive bonding material into a plurality of cavities in a mold, the fill head comprising:
   a seal support groove situated on a bottom surface, wherein the seal support groove includes:
   a first side wall;
   a second side wall situated opposite the first side wall;
   a horizontal upper wall situated above at least one of the first side wall and the second side wall; and
   a relief area extending higher than the horizontal upper wall of the seal support groove, wherein the relief area is offset from a center of the seal support groove; and
   a seal situated within the seal support groove, wherein the seal includes:
   a first outer wall, wherein the first outer wall is configured to abut the first side wall of the seal support groove, wherein the first side wall of the support groove is substantially parallel to the first outer wall;
   a second outer wall, wherein the second outer wall is configured to abut the second side wall of the seal support groove, wherein the second side wall of the support groove is substantially parallel to the second outer wall;
   an upper horizontal wall situated between and substantially perpendicular to the first outer wall and the second outer wall, wherein the upper horizontal wall is substantially parallel to the horizontal upper wall of the support groove, where a first portion of the upper horizontal wall abuts the horizontal upper wall of the support groove, and wherein the relief area of the seal support groove is open to a second portion of the upper horizontal wall; and a contact surface adjoining and extending downward from the first outer wall and the second outer wall, wherein the relief area of the seal support groove is configured to accept a portion of the upper horizontal wall therein.

9. The fill head of claim 8, wherein the first outer wall of the seal is one of substantially vertical and angled, and wherein the second outer wall of the seal is one of substantially vertical and angled.

10. The fill head of claim 8, wherein the first side wall of the seal support groove abuts the first outer wall of the seal, the second side wall of the seal support groove abuts the second outer wall of the seal, and wherein at least a first upper portion of the seal abuts a portion of the horizontal upper wall of the seal support groove, thereby preventing the seal from rotating within the seal support groove.

11. A system for placing conductive bonding material into a plurality of cavities in a mold, the system comprising:

a mold comprising a plurality of cavities; and a fill head for depositing conductive bonding material on the mold, wherein the fill head moves in a linear direction across the mold, and wherein the fill head comprises:

a seal support groove situated on a bottom surface, wherein the seal support groove includes a first diagonally vertical side wall, a second diagonally vertical side wall situated opposite the first diagonally vertical side wall, and a horizontal upper wall situated above the first diagonally vertical side wall and the second diagonally vertical side wall; and a seal situated within the seal support groove, wherein the seal includes, a first diagonally vertical outer wall situated parallel to the first diagonally vertical side wall, wherein the first diagonally vertical outer wall is configured to abut the first diagonally vertical side wall of the seal support groove, a second diagonally vertical outer wall situated parallel to the second diagonally vertical side wall, wherein the second diagonally vertical outer wall is configured to abut the second diagonally vertical side wall of the seal support groove, a first diagonally vertical inner wall, and a second diagonally vertical inner wall, wherein the seal further comprises a resilient material molded between the first diagonally vertical inner wall and the second diagonally vertical inner wall, the seal further comprising at least a portion configured to abut a bottom surface of the horizontal upper wall of the seal support groove, and a contact surface adjoining and extending downward from the first diagonally vertical outer wall and the second diagonally vertical outer wall towards the mold, wherein at least a portion of the contact surface is for contacting the mold, and wherein a width of a widest portion of the seal is less than a width of the support groove, and the seal support grove further comprising a relief area situated between the horizontal upper wall and the resilient material of the seal.

* * * * *